(12) United States Patent
Taylor et al.

(10) Patent No.: US 9,304,174 B1
(45) Date of Patent: Apr. 5, 2016

(54) CROSS-COUPLED VOLTAGE AND TEMPERATURE MONITORING IN PROGRAMMABLE INTEGRATED CIRCUITS

(71) Applicant: Xilinx, Inc., San Jose, CA (US)

(72) Inventors: Bradley L. Taylor, Santa Cruz, CA (US); Sagheer Ahmad, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 46 days.

(21) Appl. No.: 14/463,560

(22) Filed: Aug. 19, 2014

(51) Int. Cl.
*H03K 19/177* (2006.01)
*G06F 1/00* (2006.01)
*G01R 31/40* (2014.01)
*G01R 17/02* (2006.01)
*G01R 19/00* (2006.01)
*G01K 17/00* (2006.01)

(52) U.S. Cl.
CPC .............. *G01R 31/40* (2013.01); *G01K 17/00* (2013.01); *G01R 17/02* (2013.01); *G01R 19/0084* (2013.01); *H03K 19/177* (2013.01); *H03K 19/17784* (2013.01)

(58) Field of Classification Search
USPC ......... 326/37–41, 47, 101; 713/300, 330, 340
See application file for complete search history.

(56) References Cited

U.S. PATENT DOCUMENTS

| | | | | |
|---|---|---|---|---|
| 6,191,499 B1 * | 2/2001 | Severson | ................... | G06F 1/26 307/31 |
| 7,142,009 B1 * | 11/2006 | Watt | ................... | H03K 19/0008 326/38 |
| 7,142,404 B1 * | 11/2006 | Bikulcius | ................... | G06F 1/28 340/635 |
| 7,421,605 B2 * | 9/2008 | Balasubramanian | | H03K 17/687 713/300 |
| 2014/0232455 A1 * | 8/2014 | Teh | ...................... | H02M 3/1588 327/541 |

* cited by examiner

*Primary Examiner* — Douglas W Owens
*Assistant Examiner* — James H Cho
(74) *Attorney, Agent, or Firm* — Robert M. Brush

(57) ABSTRACT

Method and apparatus for monitoring system operations in an integrated circuit. A method includes receiving a first power supply voltage from a first processing domain, comparing the first power supply voltage to a first reference voltage, receiving the second power supply voltage from the second processing domain, comparing the second power supply voltage to a second reference voltage, determining that the first power supply voltage exceeds the first reference voltage or that the second power supply voltage exceeds the second reference voltage, and transmitting one or more alarms corresponding to one or more of the first power supply voltage and the second power supply voltage in response to determining that the first power supply voltage exceeds the first reference voltage or that the second power supply voltage exceeds the second reference voltage. An integrated circuit and system monitor are also provided.

20 Claims, 6 Drawing Sheets

CROSS-COUPLED VOLTAGE AND TEMPERATURE MONITORING IN PROGRAMMABLE INTEGRATED CIRCUITS

TECHNICAL FIELD

Examples of the present disclosure generally relate to electronic circuit design and, in particular, to cross-coupled voltage and temperature monitoring in programmable integrated circuits.

BACKGROUND

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks. Many programmable ICs include hard-wired processors for performing certain functions.

Electrical components within programmable ICs are generally kept within specified operating conditions. For example, electrical components are maintained above a certain minimum voltage and below a certain maximum voltage. Often, monitors are provided on-board the IC to obtain measurements of operating conditions such as voltage for the electrical components within the ICs. These monitors can fail or perform poorly if the monitors are operating outside of specified parameters, such as voltage or temperature. Moreover, because monitors are typically powered by or physically close to the electrical components that they are monitoring, monitors may fail due to operating outside of specified parameters at the same time that the elements being monitored fail. Thus, in many situations, monitors may ineffectively monitor their assigned components.

SUMMARY

A method is provided for monitoring a first power supply voltage providing power to a first processing domain and a second power supply voltage providing power to a second processing domain, the first processing domain including user-configurable electronic logic, the second processing domain including hard-wired electronic logic. The method includes receiving, at a processing domain, the first power supply voltage. The method also includes comparing, at the processing domain, the first power supply voltage to a first reference voltage. The method further includes receiving, at the processing domain, the second power supply voltage. The method also includes comparing, at the processing domain, the second power supply voltage to a second reference voltage. The method further includes determining that the first power supply voltage exceeds the first reference voltage or that the second power supply voltage exceeds the second reference voltage. The method also includes transmitting one or more alarms corresponding to one or more of the first power supply voltage and the second power supply voltage in response to determining that the first power supply voltage exceeds the first reference voltage or that the second power supply voltage exceeds the second reference voltage. The processing domain comprises either the first processing domain or the second processing domain.

An integrated circuit is also provided. The integrated circuit includes a first processing domain including user-configurable electronic logic, a second processing domain including hard-wired electronic logic, and a first system monitor that includes a first controller. The first controller is configured to receive the first power supply voltage from the first processing domain. The first controller is also configured to compare the first power supply voltage to a first reference voltage. The first controller is further configured to receive the second power supply voltage from the second processing domain. The first controller is also configured to compare the second power supply voltage to a second reference voltage. The first controller is further configured to determine that the first power supply voltage exceeds the first reference voltage or that the second power supply voltage exceeds the second reference voltage. The first controller is also configured to transmit a first alarm corresponding to one of the first power supply voltage and the second power supply voltage in response to determining that the first power supply voltage exceeds the first reference voltage or that the second power supply voltage exceeds the second reference voltage.

A system monitor is also provided. The system monitor includes a first controller. The first controller is configured to receive a first power supply voltage from a first processing domain that includes user-configurable electronic logic. The first controller is also configured to compare the first power supply voltage to a first reference voltage. The first controller is further configured to receive a second power supply voltage from the second processing domain that includes hard-wired electronic logic. The first controller is also configured to compare the second power supply voltage to a second reference voltage. The first controller is further configured to determine that the first power supply voltage exceeds the first reference voltage or that the second power supply voltage exceeds the second reference voltage. The first controller is further configured to transmit a first alarm corresponding to one of the first power supply voltage and the second power supply voltage in response to determining that the first power supply voltage exceeds the first reference voltage or that the second power supply voltage exceeds the second reference voltage.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting in scope.

To facilitate understanding, identical reference numerals have been used, where possible, to designate identical elements that are common to the figures. It is contemplated that elements of one example may be beneficially incorporated in other examples.

DETAILED DESCRIPTION

A programmable integrated circuit ("IC") with multiple cross-coupled system monitors is described herein. The IC generally includes a programmable logic domain that includes configurable tiles and a processing system domain that includes a hard-wired processor. The programmable logic domain and the processing system domain both include system monitors that monitor operating characteristics of electrical components within the respective processing domain. Additionally, the system monitors are cross-coupled so that each system monitor receives monitoring inputs that the other system monitor receives. For example, a system monitor that resides in the programmable logic domain receives monitoring inputs from the processing system domain as well as the programmable logic domain. This cross-coupling provides for redundant checks on system operations, which improves monitoring reliability. This improved monitoring reliability may also hinder security attacks such as voltage hacking attacks.

Figure 1:
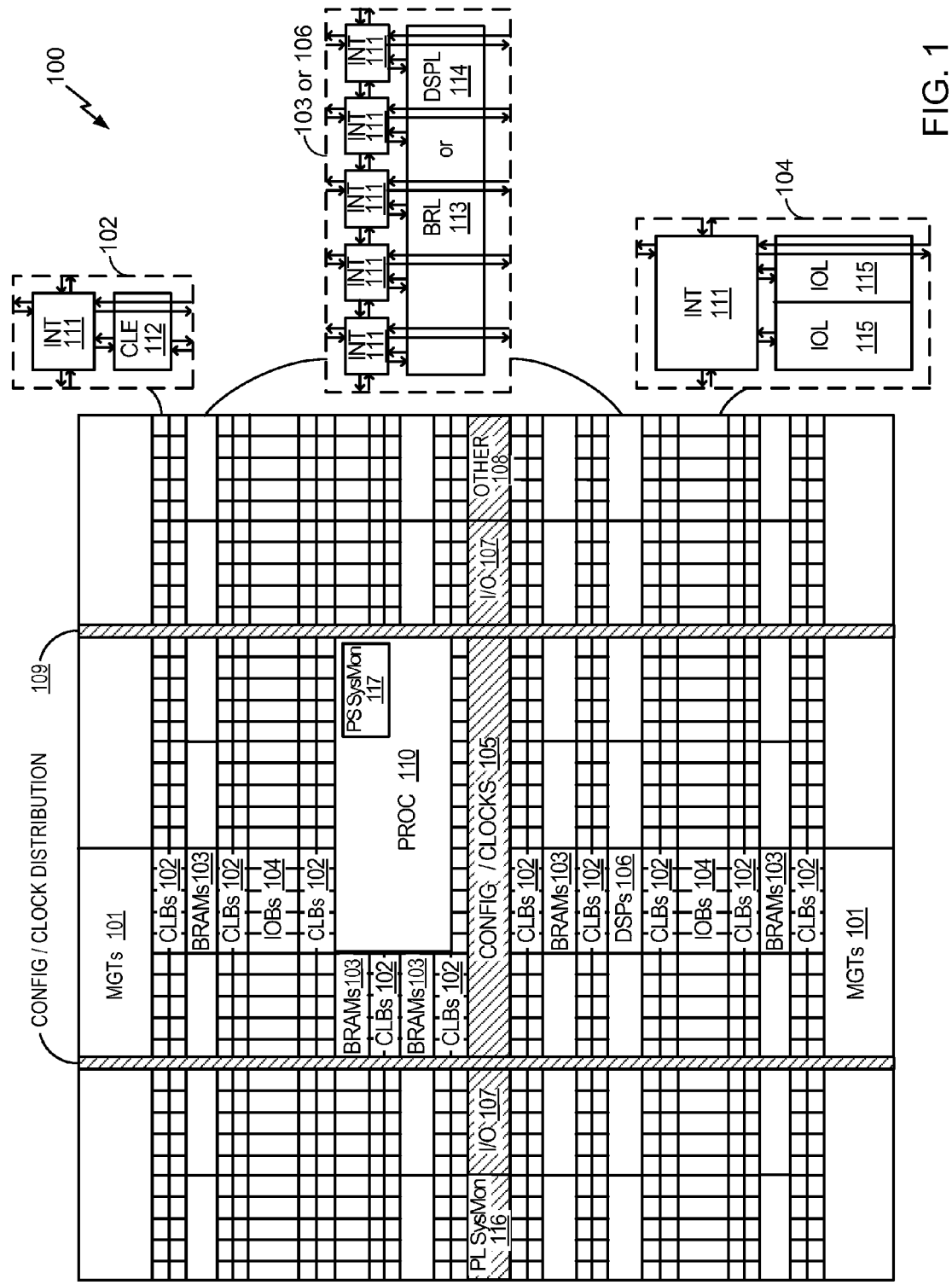
FIG. 1 illustrates an integrated circuit architecture according to an example implementation.

FIG. 1 illustrates an integrated circuit ("IC") 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. The IC 100 may be a field programmable gate array ("FPGA") architecture. IC 100 also includes a dedicated processor, also referred to as a "processing system" or "PROC" 110.

Elements of the IC 100 outside of PROC 110 may be referred to herein as the programming logic domain (or "PL domain") and elements within PROC 110 may be referred to herein as the processing system domain (or "PS domain"). The PL domain and PS domain, are referred to as "processing domains." A first power supply (not shown) provides one or more power supply signals to power the PL domain, and a second power supply (also not shown) provides one or more power supply signals to power the PS domain. The power supply signals that power the PL domain may be different from the power supply signals that power the PS domain. The IC 100 includes programmable logic system monitor 116 ("PL Sysmon") that monitors activity (voltages, temperature, and the like) for the PL domain. The IC 100 also includes PS system monitor 117 ("PS sysmon") that monitors activity (voltages, temperature, and the like) of the PS domain.

Optionally, each programmable tile includes a programmable interconnect element ("INT") 111 having standardized connections to and from a corresponding interconnect element in each adjacent tile. The programmable interconnect elements taken together implement the programmable interconnect structure for the illustrated IC 100. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements 111. Typically, the number of interconnect elements 111 included in a tile depends on the height of the tile. In the pictured IC 100, a BRAM tile 103 has the same height as five CLBs 102, but other numbers (e.g., four) can also be used. A DSP tile 106 can include a DSP logic element ("DSPL") 114 in addition to an appropriate number of programmable interconnect elements 111. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured IC 100, a horizontal area near the center of the die (shown in FIG. 1) is used for configuration, clock, PL sysmon 116, I/O 107, and other control logic. Vertical columns 109 extending from this horizontal area or column are used to distribute the clocks and configuration signals across the breadth of the IC.

Optionally, IC 100 includes additional logic blocks that disrupt the regular columnar structure making up a large part of the IC. The additional logic blocks can be programmable blocks and/or dedicated logic. For example, processor block 110 spans several columns of CLBs and BRAMs.

PROC 110 can be implemented as a hard-wired processor that is fabricated as part of the die that implements the programmable circuitry of the IC 100 and does not include the programmable tiles included within the PL domain. PROC 110 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 110 can include one or more cores, e.g., central processing units, cache memories, a memory controller, unidirectional and/or bidirectional interfaces configurable to couple directly to I/O pins, e.g., I/O pads, of the IC 100 and/or couple to the programmable circuitry of the IC 100. The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC 100. For example, portions shown in FIG. 1 that are external to PROC 110 can be considered part of the, or the, programmable circuitry of the IC 100.

Note that FIG. 1 is intended to illustrate only an exemplary IC 100 architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC 100 more than one adjacent row of CLBs 102 is typically included wherever the CLBs 102 appear, to facilitate the efficient implementation of user logic, but the number of adjacent CLB 102 rows varies with the overall size of the IC 100.

Figure 2A:
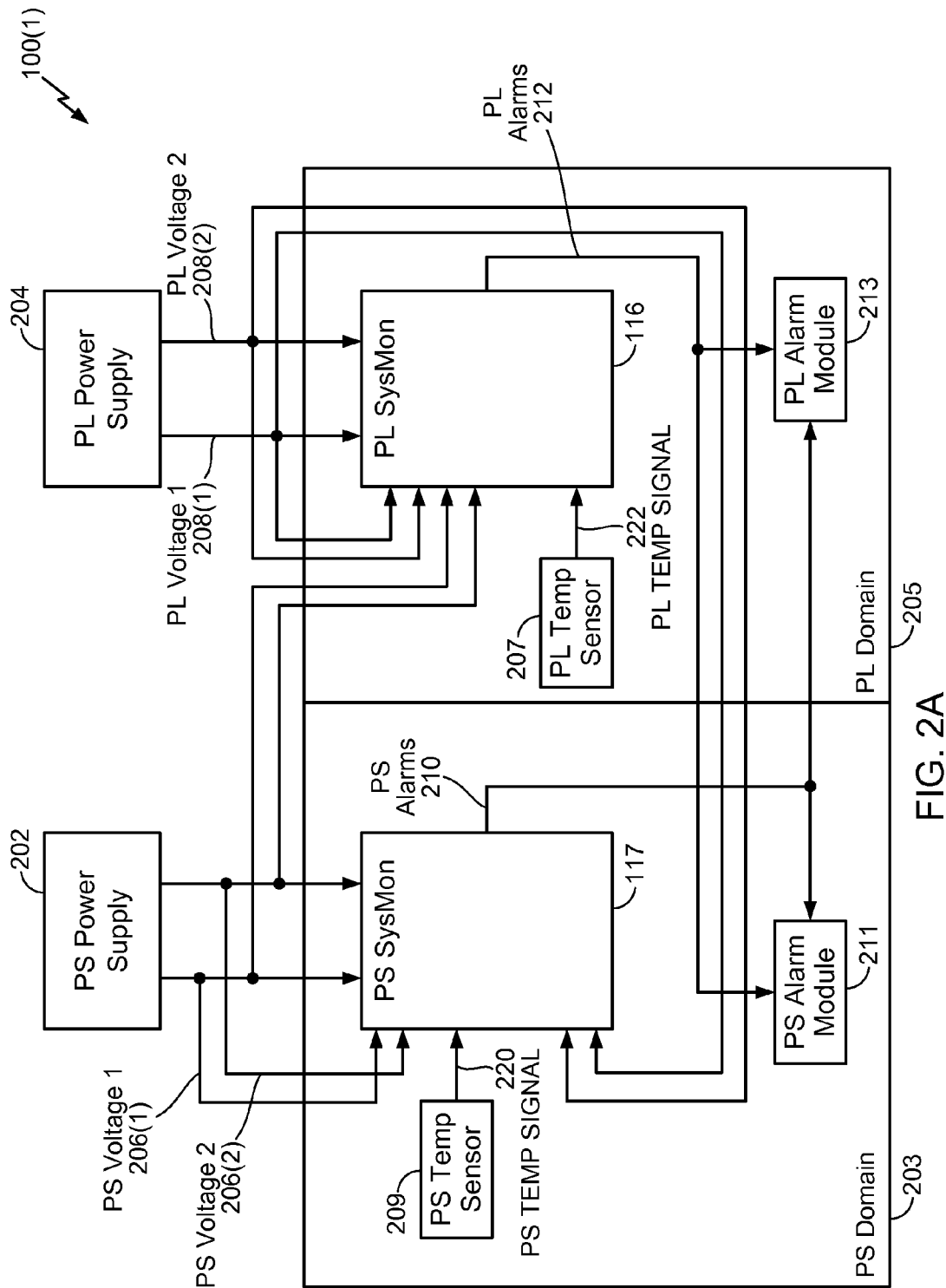
FIG. 2A illustrates the integrated circuit architecture of FIG. 1, showing connections between the processing system (PS) system monitor and the programmable logic (PL) system monitor depicted in FIG. 1, according to one example.

FIG. 2A is an illustration of an example IC architecture 100(1) associated with the IC 100 of FIG. 1, showing connections between the PS system monitor 117 ("PS sysmon") and the PL system monitor 116 ("PL sysmon") depicted in FIG. 1, as well as other elements such as power supplies that power a PL domain 205 and a PS domain 203, according to one example.

PS domain 203 includes the PS sysmon 117, a PS temperature sensor 209, and a PS alarm module 211, as well as other elements not shown. PS sysmon 117 is communicatively coupled to the PS temperature sensor 209, the PS alarm module 211, and a PL alarm module 213. PL domain 205 includes the PL sysmon 116, a PL temperature sensor 207, and the PL alarm module 213, as well as other elements not shown. The PL sysmon 116 is communicatively coupled to the PL temperature sensor 207, the PS alarm module 211, and the PL alarm module 213.

As described above, the processing system domain ("PS domain") 203 is powered by a power supply—the power system power supply (PS power supply) 202. PS power supply 202 provides PS voltage signals 206 to the PS domain 203 for powering components of PS domain 203. FIG. 2 depicts two different PS voltage signals 206 being applied, but a different number of PS voltage signals 206 could alternatively be applied to PS domain 203. Because PS voltage signals 206 power PS domain 203, PS voltage signals 206 also power PS sysmon 117, which is in PS domain 203. Additionally, PS sysmon 117 receives the PS voltage signals 206 as voltage monitoring inputs. PS sysmon 117 monitors the PS voltage signals 206 received as voltage monitoring inputs and sends out an alarm via PS alarm 210 if a monitored voltage is above a high threshold or below a low threshold. Alarms are sent to both PS alarm module 211, in PS domain 203, and to PL alarm module 213, in PL domain 205.

Also as described above, the programmable logic domain ("PL domain") 205 is powered by the PL power supply 204. PL power supply 204 provides PL voltage signals 208 to the PL domain 205. As with the PS domain 203, with the PL domain 205, FIG. 2 depicts two different PL voltage signals 208 being applied, but a different number of PL voltage signals 208 could alternatively be applied to PL domain 205. Because PL domain 205 is powered by PL power supply 204, PL sysmon 116 is also powered by PL power supply 204, and thus receives PL voltage signals 208. PL voltage signals 208 are also provided to PL sysmon 116 as voltage monitoring inputs. Thus, PL sysmon 116 monitors the PL voltage signals 208 for an incursion below a low threshold or above a high threshold and sends out a PL alarm 212 if such an incursion occurs. Alarms are sent via PL alarms 212 to both PS alarm module 211, in PS domain 203, and to PL alarm module 213, in PL domain 205.

The voltage signals for the PS domain 203 and the PL domain 205 are cross-coupled for both PS sysmon 117 and PL sysmon 116. Thus, in addition to receiving PS voltage signals 206 as voltage monitoring inputs, PS sysmon 117 also receives PL voltage signals 208 as voltage monitoring inputs. Thus, PS sysmon 117 monitors the PL voltage signals 208 for an incursion below a low threshold or above a high threshold and sends out a PL alarm 212 if such an incursion occurs.

Similarly, in addition to receiving PL voltage signals 208 as voltage monitoring inputs, PL sysmon 116 receives PS voltage signals 206 as voltage monitoring inputs. Thus, PL sysmon 116 monitors the PS voltage signals 206 for an incursion below a low threshold or above a high threshold and sends out a PS alarm 210 if such an incursion occurs.

Because the PS sysmon 117 receives voltages from PL domain 205, the PS sysmon 117 is able to monitor the voltages for the PL domain 205 in the situation that the PL sysmon 116 is not functional. Similarly, because the PL sysmon 116 receives voltages from the processing system 110, the PL sysmon 116 is able to monitor the voltages for the processing system 110 in the situation that the PS sysmon 117 is not functional.

The PS sysmon 117 also receives a PS temperature signal 220 from PS temperature sensor 209. If the PS sysmon 117 determines that the PS temperature signal 220 is above a threshold, then the PS sysmon 117 generates and transmits a corresponding PS alarm 210. Similarly, the PL sysmon 116 also receives a PL temperature signal 222 from PL temperature sensor 207. If the PL sysmon 116 determines that the PL temperature signal 222 is above a threshold, then the PL sysmon 116 generates and transmits a corresponding PL alarm. The temperature signals are not cross-wired. However, temperature changes at specific portions of the IC 100(1) are quickly transmitted to other portions of the IC 100(1) via thermal conduction. Although the temperature signals are not cross-wired in the example IC architecture 100(1) of FIG. 2A, the temperature signals may be cross-wired, as in the example IC architecture 100(2) of FIG. 2B.

The PS Sysmon 117 is coupled to both a PS alarm module 211, which is in PS domain 203 and a PL alarm module 213, which is in PL domain 205. Thus, when PS sysmon 117 generates an alarm, PS sysmon 117 sends that alarm to both the PS alarm module 211 and the PL alarm module 213. PS alarm module 211 and PL alarm module 213 may be any combination of hardware and software that is programmed and/or arranged to recognize at least one alarm received from PS sysmon 117 and PL sysmon 116. The alarms sent by PS sysmon 117 and PL sysmon 116 may include information such as which signal (e.g., voltage or temperature) generated the alarm, what threshold (e.g., high voltage or low voltage) the alarm corresponds to, the value of the signal that triggered the alarm, and other information about the event that cause the alarm to trigger. For example, one example alarm may include information that PS voltage 1 206(1) exceeded a high threshold. In response to the alarms, other elements within the PS domain 203 and/or PL domain 205 may take appropriate actions such as powering down, saving data, and the like.

Figure 2B:
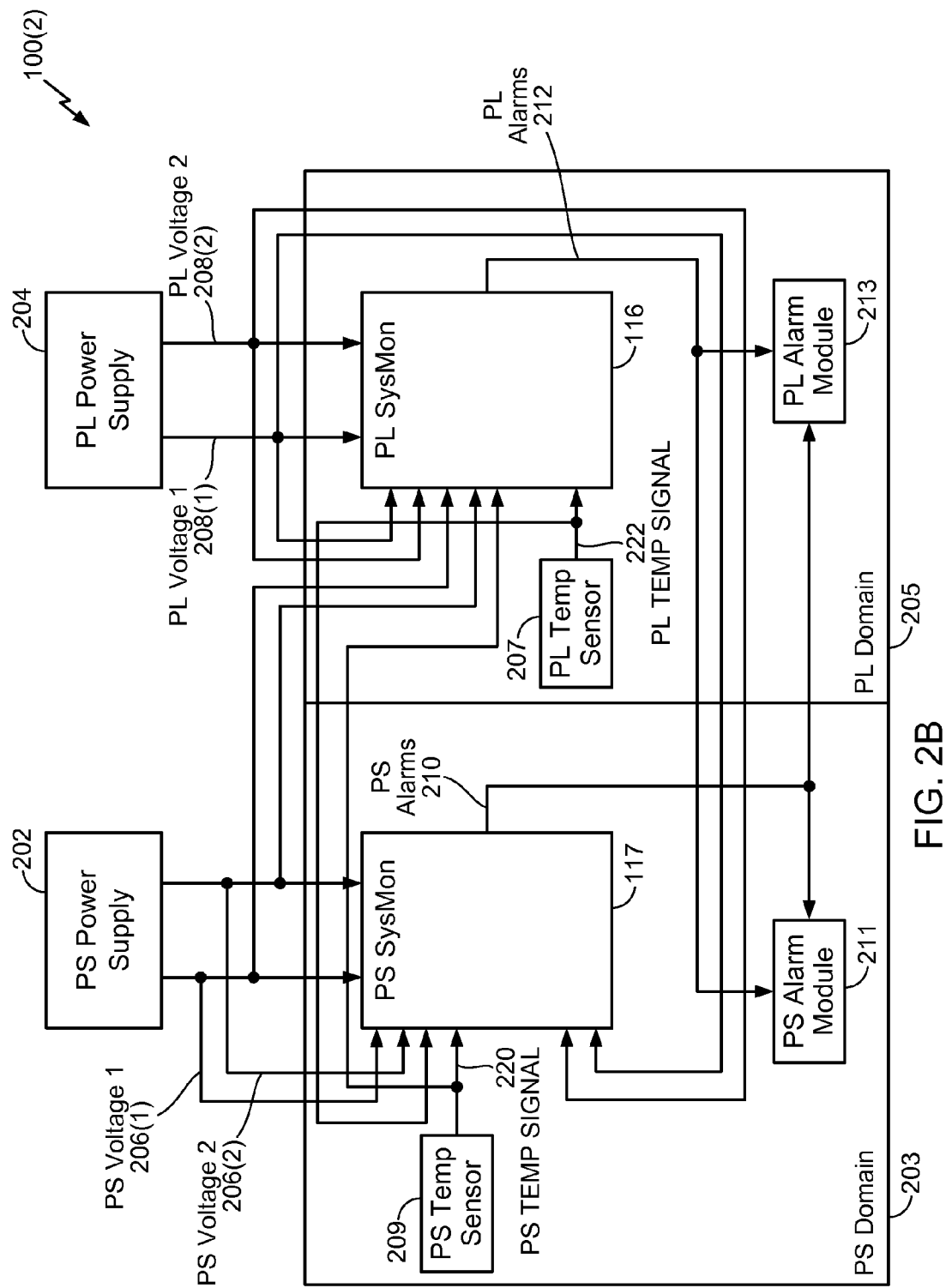
FIG. 2B illustrates the integrated circuit architecture of FIG. 1, according to another example.

FIG. 2B illustrates another example IC architecture 100(2) associated with the IC 100 of FIG. 1. The integrated circuit 100(2) illustrated in FIG. 2B is similar to the integrated circuit 100(1) illustrated in FIG. 2A, except that in the integrated circuit 100(2), the PS temp signal 220 and PL temp signal 222 are both cross-coupled.

More specifically, the PS temp signal 220 is coupled to both PS sysmon 117 and to PL sysmon 116, and the PL temp signal 222 is coupled to both PS sysmon 117 and to PL sysmon 116. This cross-coupling allows both PS sysmon 117 and PL sysmon 116 to detect temperature excursions (temperature meeting a particular threshold) in both the PS domain 203 and the PL domain 205. More specifically, the PS sysmon 117 and the PL sysmon 116 are both configured to detect whether either the PS temperature signal 220 or the PL temperature signal 222 meet a particular temperature threshold, which may be pre-programmed, dynamically determined, or the like. This cross-coupling thus allows temperature excursions in either processing domain to be detected by either processing domain.

Figure 3:
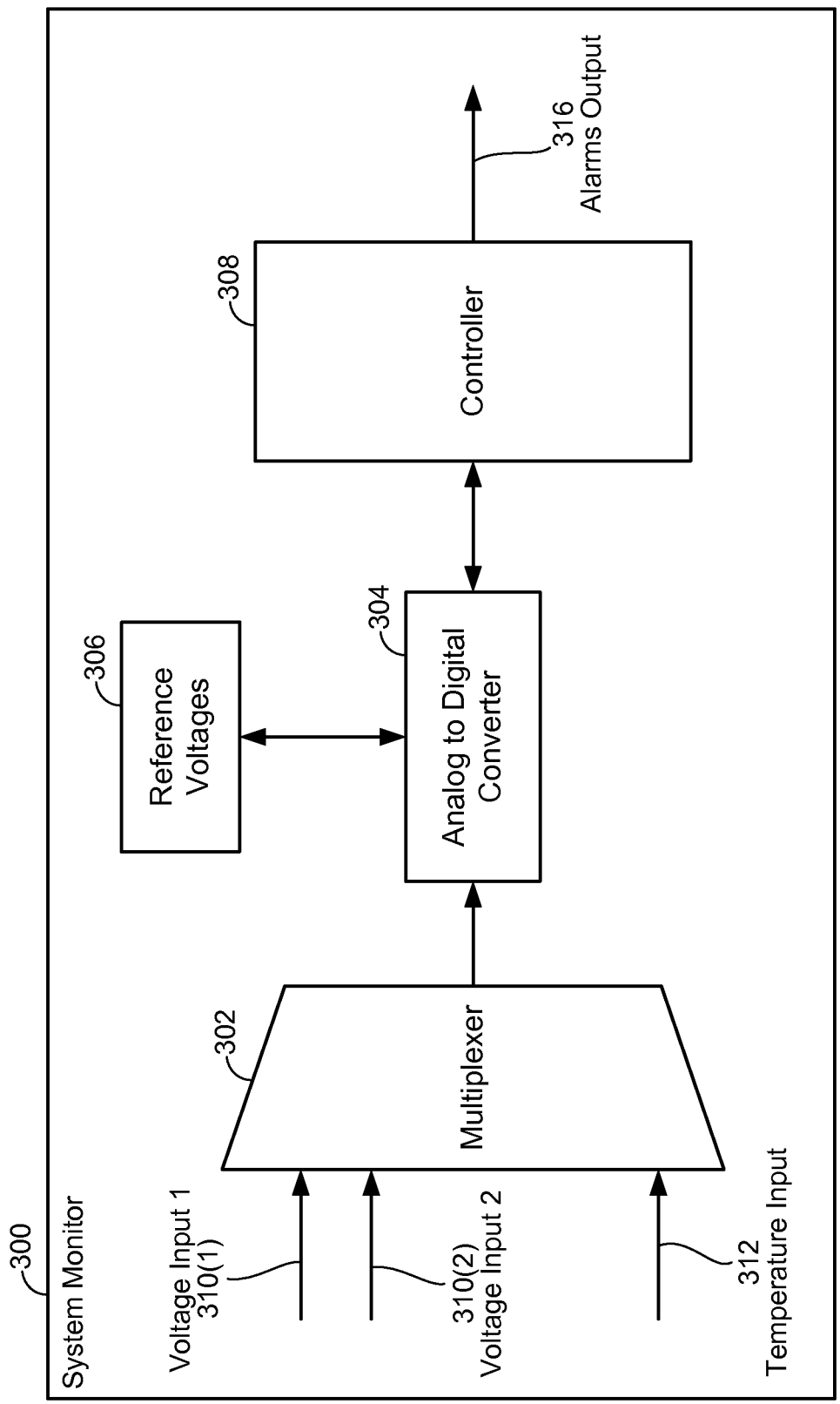
FIG. 3 is a block diagram of a system monitor for use in the integrated circuit architecture of FIG. 1.

FIG. 3 is an illustration of a system monitor 300 for use in the IC 100. The system monitor 300 could be either or both of the PL sysmon 116 or PS sysmon 117. The system monitor 300 includes a multiplexer 302 that receives voltage inputs 310 and temperature input 312, an analog to digital converter 304, reference voltages 306, and a controller 308 that outputs alarm outputs 316.

The multiplexer 302 receives the voltage inputs 310 and temperature input 312 and selects one of those inputs to provide to the analog to digital converter 304. The voltage inputs 310 could be any of voltage signals 206 or voltage signals 208. The temperature input 312 could be either the PS temperature signal 220 or the PL temperature signal 222. Although a certain number of voltage inputs 310 and temperature inputs 312 are depicted in FIG. 3, the system monitor 300 could include any number of voltage inputs 310 or temperature inputs 312.

The analog to digital converter 304 converts the input signal provided from the multiplexer 302 and the reference voltage provided from analog signals into a digital signal and provides the converted digital signal to the controller 308. The reference voltages may include either or both of a high threshold voltage and a low threshold voltage. The controller 308 compares the received input voltage to the received reference voltage. If the input voltage exceeds the reference voltage, then the controller 308 generates and sends an alarm via alarm output 316. The controller 308 periodically polls each voltage input 310 and temperature input 312, by controlling the multiplexer 302 and analog to digital converter 304 so that each input to the system monitor 300 is compared to a reference voltage for checking.

Figure 4:
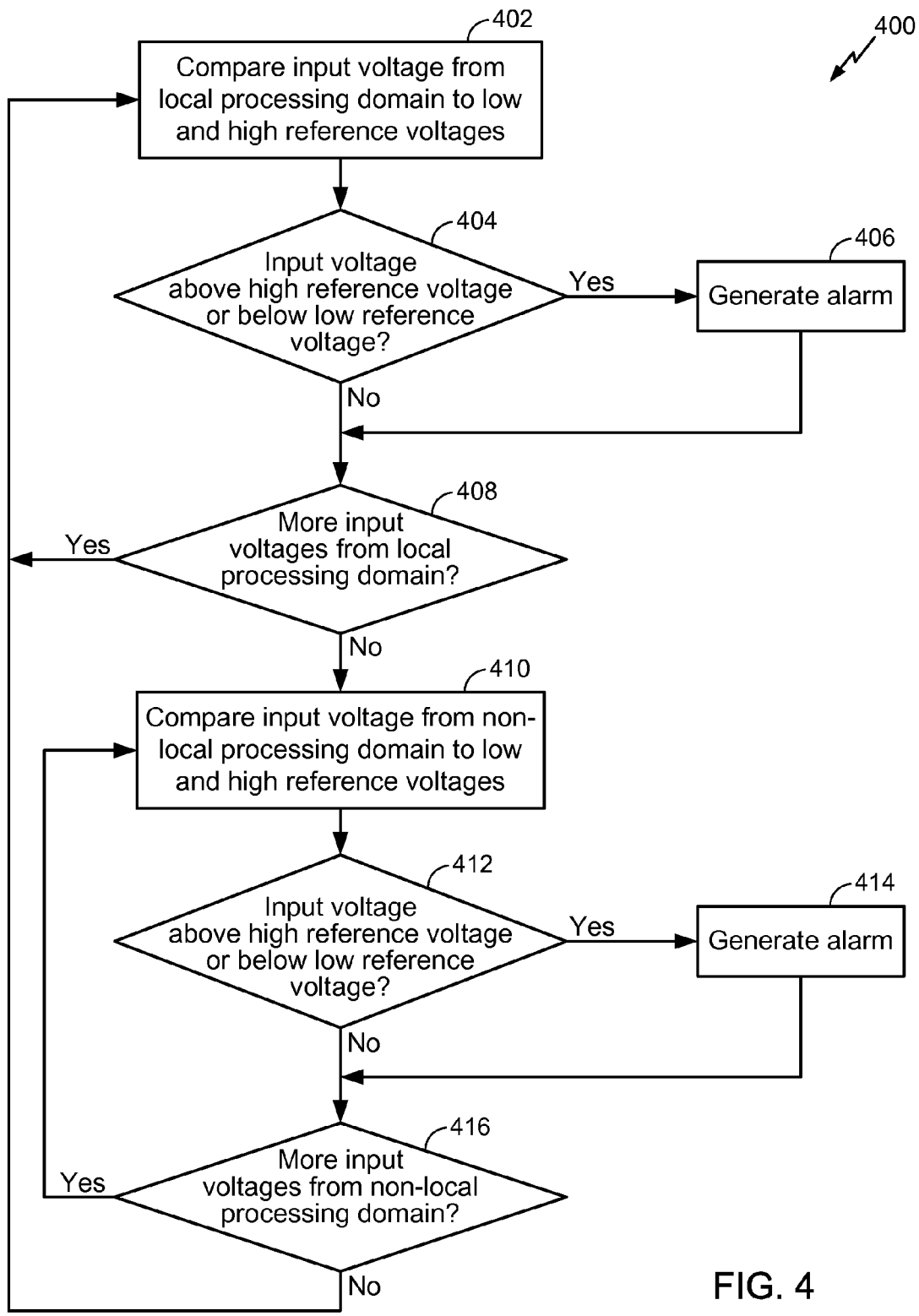
FIG. 4 is a flow diagram of method steps for monitoring system voltage characteristics in a cross-coupled fashion.

FIG. 4 is a flow diagram of method steps for monitoring system voltage characteristics in a cross-coupled fashion. Although the method steps are described in conjunction with FIGS. 1-3, persons skilled in the art will understand that any system configured to perform the method steps in various alternative orders falls within the scope of the present disclosure.

The method 400 begins at step 402, at which the controller 308 in a system monitor 300 compares an input received from a local processing domain to a reference voltage. A "local processing domain" is the processing domain in which the controller 308 is located. For example, if the controller 308 is located in the PS domain 203, then the local processing domain is the PS domain 203. At step 404, the controller 308 determines whether the input voltage is above a high threshold or below a low threshold (i.e., whether an excursion has happened). If an excursion has occurred, then the method proceeds to step 406, in which the controller 308 generates an alarm. After step 406, the method proceeds to step 408. At step 404, if an excursion has not occurred, then the method proceeds to step 408.

At step 408, the controller 308 determines whether there are more input voltages for the local processing domain to compare. If there are more input voltages to compare, then the method returns to step 402. If there are not more input voltages, then the method proceeds to step 410, at which the controller 308 compares an input voltage from a non-local processing domain to a reference voltage. A non-local processing domain is the processing domain that is not the processing domain that the controller 308 is in. For example, if the controller 308 is in the PS domain 203, the non-local processing domain is the PL domain 205.

At step 412, if the input voltage is above a high threshold or below a low threshold, then the method proceeds to step 414, at which the controller 308 generates an alarm. After step 414, the method proceeds to step 416. If, at step 412, the controller determines that the input voltage is not above a high threshold or below a low threshold, then the method proceeds to step 416. At step 416, the controller 308 determines whether there are more input voltages to compare. If there are more input voltages to compare, then the method returns to step 410. If there are not more input voltages to compare, then the current set of polling operations is complete and the method returns to step 402.

Figure 5:
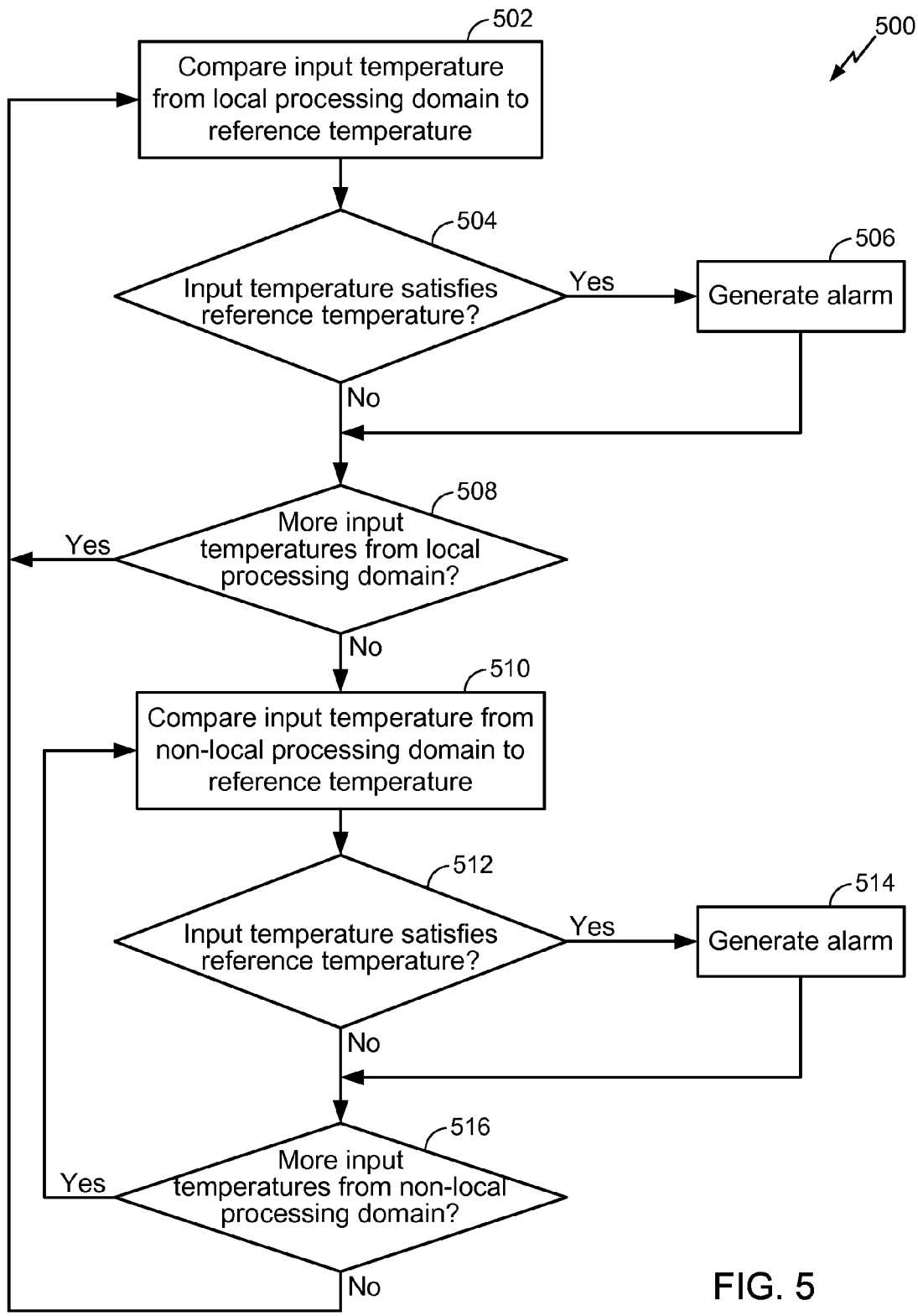
FIG. 5 is a flow diagram of method steps for monitoring system temperature characteristics in a cross-coupled fashion.

FIG. 5 is a flow diagram of method steps for monitoring system temperature characteristics in a cross-coupled fashion. Although the method steps are described in conjunction with FIGS. 1-3, persons skilled in the art will understand that any system configured to perform the method steps in various alternative orders falls within the scope of the present disclosure.

The method 500 begins at step 502, at which the controller 308 in a system monitor 300 compares an input received from a local processing domain to a reference temperature. As described above, a "local processing domain" is the processing domain in which the controller 308 is located. For example, if the controller 308 is located in the PS domain 203, then the local processing domain is the PS domain 203. At step 504, the controller 308 determines whether the input temperature meets a temperature threshold (i.e., whether an excursion has happened). If an excursion has occurred, then the method proceeds to step 506, in which the controller 308 generates an alarm. After step 506, the method proceeds to step 508. At step 504, if an excursion has not occurred, then the method proceeds to step 508.

At step 508, the controller 308 determines whether there are more input temperatures for the local processing domain to compare. If there are more input temperatures to compare, then the method returns to step 502. If there are not more input temperatures, then the method proceeds to step 510, at which the controller 308 compares an input temperature from a non-local processing domain to a reference temperature. As described above, a non-local processing domain is the processing domain that is not the processing domain that the controller 308 is in. For example, if the controller 308 is in the PS domain 203, then the non-local processing domain is the PL domain 205.

At step 512, if the input temperature satisfies a threshold temperature, then the method proceeds to step 514, at which the controller 308 generates an alarm. After step 514, the method proceeds to step 516. If, at step 512, the controller 308 determines that the input temperature does not satisfy a threshold, then the method proceeds to step 516. At step 516, the controller 308 determines whether there are more input temperatures to compare. If there are more input temperatures to compare, then the method returns to step 510. If there are not more input temperatures to compare, then the current set of polling operations is complete and the method returns to step 502.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A method for monitoring a first power supply voltage providing power to a first processing domain and a second power supply voltage providing power to a second processing domain, the first processing domain including user-configurable electronic logic, the second processing domain including hard-wired electronic logic, the method comprising:
   receiving, at a processing domain, the first power supply voltage;
   comparing, at the processing domain, the first power supply voltage to a first reference voltage;
   receiving, at the processing domain, the second power supply voltage;
   comparing, at the processing domain, the second power supply voltage to a second reference voltage;
   determining that the first power supply voltage exceeds the first reference voltage or that the second power supply voltage exceeds the second reference voltage; and
   transmitting one or more alarms corresponding to one or more of the first power supply voltage and the second power supply voltage in response to determining that the first power supply voltage exceeds the first reference voltage or that the second power supply voltage exceeds the second reference voltage,
   wherein the processing domain comprises either the first processing domain or the second processing domain.

2. The method of claim 1, further comprising:
   receiving a third power supply voltage from the first processing domain;
   comparing the third power supply voltage to a third reference voltage;
   determining that the third power supply voltage exceeds the third reference voltage; and
   transmitting one or more alarms corresponding to the third power supply voltage in response to determining that the third power supply voltage exceeds the third reference voltage.

3. The method of claim 2, further comprising:
   receiving a fourth power supply voltage from the second processing domain;
   comparing the fourth power supply voltage to a fourth reference voltage;
   determining that the fourth power supply voltage exceeds the fourth reference voltage; and
   transmitting one or more alarms corresponding to the fourth power supply voltage in response to determining that the fourth power supply voltage exceeds the fourth reference voltage.

4. The method of claim 1, wherein transmitting the one or more alarms comprises:
   transmitting the one or more alarms to a first alarm module included in the first processing domain.

5. The method of claim 4, wherein transmitting the one or more alarms further comprises:
   transmitting the one or more alarms to a second alarm module included in the second processing domain.

6. The method of claim 1, further comprising:
   receiving a first temperature signal from the first processing domain;
   comparing the temperature signal to a first reference temperature;
   determining that the first temperature signal exceeds the first reference temperature; and
   transmitting one or more alarms corresponding to the first temperature signal in response to determining that the first temperature signal exceeds the first reference temperature.

7. The method of claim 6, wherein transmitting the one or more alarms comprises:
   transmitting the one or more alarms to a first alarm module included in the first processing domain.

8. The method of claim 7, wherein transmitting the one or more alarms further comprises:
   transmitting the one or more alarms to a second alarm module included in the second processing domain.

9. An integrated circuit, comprising:
   a first processing domain including user-configurable electronic logic;
   a second processing domain including hard-wired electronic logic; and
   a first system monitor comprising:
      a first controller configured to:
         receive the first power supply voltage from the first processing domain;
         compare the first power supply voltage to a first reference voltage;
         receive the second power supply voltage from the second processing domain;
         compare the second power supply voltage to a second reference voltage;
         determine that the first power supply voltage exceeds the first reference voltage or that the second power supply voltage exceeds the second reference voltage; and
         transmit a first alarm corresponding to one of the first power supply voltage and the second power supply voltage in response to determining that the first power supply voltage exceeds the first reference voltage or that the second power supply voltage exceeds the second reference voltage.

10. The integrated circuit of claim 9, further comprising:
    a second system monitor comprising:
       a second controller configured to:
          receive the first power supply voltage from the first processing domain;
          compare the first power supply voltage to a first reference voltage;
          receive the second power supply voltage from the second processing domain;
          compare the second power supply voltage to a second reference voltage;

determine that the first power supply voltage exceeds the first reference voltage or that the second power supply voltage exceeds the second reference voltage; and transmit a second alarm corresponding to one or more of the first power supply voltage and the second power supply voltage in response to determining that the first power supply voltage exceeds the first reference voltage or that the second power supply voltage exceeds the second reference voltage.

11. The integrated circuit of claim 10, further comprising:

a first alarm module included in the first processing domain; and a second alarm module included in the second processing domain, wherein the first system monitor is configured to transmit the first alarm to both the first alarm module and the second alarm module, and wherein the second system monitor is configured to transmit the second alarm to both the first alarm module and the second alarm module.

12. The integrated circuit of claim 9, wherein the first system monitor is further configured to:

receive a third power supply voltage from the first processing domain;

compare the third power supply voltage to a third reference voltage;

determine that the third power supply voltage exceeds the third reference voltage; and transmit one or more alarms corresponding to the third power supply voltage in response to determining that the third power supply voltage exceeds the third reference voltage.

13. The integrated circuit of claim 9, further comprising:

a first temperature sensor in the first processing domain, wherein the first system monitor is further configured to:

receive a first temperature signal from the first temperature sensor;

compare the first temperature signal to a first reference temperature;

determine that the first temperature signal exceeds the first reference temperature; and transmit one or more alarms corresponding to the first temperature signal in response to determining that the first temperature signal exceeds the first reference temperature.

14. The integrated circuit of claim 13, wherein the first system monitor is further configured to:

transmit the one or more alarms to a first alarm module included in the first processing domain.

15. The integrated circuit of claim 14, wherein the first system monitor is further configured to:

transmit the one or more alarms to a second alarm module included in the second processing domain.

16. A system monitor comprising:

a first controller configured to:

receive a first power supply voltage from a first processing domain that includes user-configurable electronic logic;

compare the first power supply voltage to a first reference voltage;

receive a second power supply voltage from the second processing domain that includes hard-wired electronic logic;

compare the second power supply voltage to a second reference voltage;

determine that the first power supply voltage exceeds the first reference voltage or that the second power supply voltage exceeds the second reference voltage; and transmit a first alarm corresponding to one of the first power supply voltage and the second power supply voltage in response to determining that the first power supply voltage exceeds the first reference voltage or that the second power supply voltage exceeds the second reference voltage.

17. The system monitor of claim 16, wherein:

the controller is configured to transmit the first alarm to both a first alarm module included in the first processing domain and a second alarm module included in the second processing domain.

18. The system monitor of claim 16, wherein the controller is further configured to:

receive a third power supply voltage from the first processing domain;

compare the third power supply voltage to a third reference voltage;

determine that the third power supply voltage exceeds the third reference voltage; and transmit one or more alarms corresponding to the third power supply voltage in response to determining that the third power supply voltage exceeds the third reference voltage.

19. The system monitor of claim 16, wherein the controller is further configured to:

receive a first temperature signal from a first temperature sensor;

compare the first temperature signal to a first reference temperature;

determine that the first temperature signal exceeds the first reference temperature; and transmit one or more alarms corresponding to the first temperature signal in response to determining that the first temperature signal exceeds the first reference temperature.

20. The system monitor of claim 16, wherein the controller is further configured to:

transmit the one or more alarms to a first alarm module included in the first processing domain.

* * * * *